United States Patent
Balakrishnan et al.

(10) Patent No.: US 9,799,777 B1
(45) Date of Patent: Oct. 24, 2017

(54) FLOATING GATE MEMORY IN A CHANNEL LAST VERTICAL FET FLOW

(71) Applicant: International Business Machines Corporation, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/288,546

(22) Filed: Oct. 7, 2016

(51) Int. Cl.
  *H01L 29/78* (2006.01)
  *H01L 29/94* (2006.01)
  *H01L 21/8234* (2006.01)
  *H01L 27/088* (2006.01)
  *H01L 29/788* (2006.01)
  *H01L 27/11524* (2017.01)
  *H01L 29/66* (2006.01)
  *H01L 29/423* (2006.01)
  *H01L 21/28* (2006.01)

(52) U.S. Cl.
  CPC .... *H01L 29/7889* (2013.01); *H01L 21/28273* (2013.01); *H01L 21/8234* (2013.01); *H01L 21/823487* (2013.01); *H01L 27/088* (2013.01); *H01L 27/11524* (2013.01); *H01L 29/42328* (2013.01); *H01L 29/66825* (2013.01)

(58) Field of Classification Search
  CPC .......... H01L 29/7889; H01L 29/42328; H01L 29/66825; H01L 21/28273; H01L 21/8234; H01L 21/823487; H01L 27/11524; H01L 27/088
  USPC ....... 257/316, 326, 328, 329, 380, 392, 401, 257/E29.262, E29.304, E29.306, E21.649, 257/E21.652, E21.655, E21.693, E27.084, 257/E27.086, E27.103; 365/232, 185.29; 438/268, 270, 283, 294, 300
  See application file for complete search history.

(56) References Cited

U.S. PATENT DOCUMENTS

| | | | | |
|---|---|---|---|---|
| 6,878,991 B1* | 4/2005 | Forbes | ............... | G11C 16/0483 257/316 |
| 8,278,694 B2* | 10/2012 | Ikebuchi | ........... | H01L 27/10823 257/302 |
| 8,486,785 B2* | 7/2013 | Masuoka | ................ | H01L 21/84 257/288 |
| 8,609,494 B2* | 12/2013 | Masuoka | ................ | H01L 21/84 257/268 |
| 9,525,064 B1* | 12/2016 | Balakrishnan | ...... | H01L 29/7827 |
| 9,543,246 B2* | 1/2017 | Takaishi | .......... | H01L 21/823487 |

(Continued)

*Primary Examiner* — Dao H Nguyen
(74) *Attorney, Agent, or Firm* — Scully, Scott, Murphy & Presser, P.C.; Louis J. Percello, Esq.

(57) ABSTRACT

A floating gate memory cell is provided on a surface of a base semiconductor substrate utilizing a vertical FET processing flow. The floating gate memory cell contains a bottom source/drain region located beneath one end of an epitaxial semiconductor channel material and a top source/drain region located above a second end of the epitaxial semiconductor channel material. A floating gate structure including an inner dielectric material portion, a floating gate portion, an outer dielectric material portion, and a control gate portion is present on each side of the epitaxial semiconductor channel material.

20 Claims, 16 Drawing Sheets

(56) References Cited

U.S. PATENT DOCUMENTS

| | | | | |
|---|---|---|---|---|
| 2008/0237637 A1* | 10/2008 | Ouyang | ............... | H01L 29/778 257/190 |
| 2009/0085102 A1* | 4/2009 | Takaishi | ............ | H01L 29/41741 257/329 |
| 2009/0200603 A1* | 8/2009 | Ogura | ............... | H01L 21/28282 257/326 |
| 2017/0162446 A1* | 6/2017 | Balakrishnan | .. | H01L 21/823487 |

* cited by examiner

FLOATING GATE MEMORY IN A CHANNEL LAST VERTICAL FET FLOW

BACKGROUND

The present application relates to a semiconductor structure and a method of forming the same. More particularly, the present application relates to a semiconductor structure including a floating gate memory cell, i.e., an erasable programmable read-only memory (EPROM) cell, that is fabricated utilizing a vertical transistor processing flow.

Conventional vertical transistors are devices where the source-drain current flows in a direction normal to the substrate surface. In such devices, a vertical semiconductor pillar defines the channel with the source and drain located at opposing ends of the semiconductor pillar. One advantage of a vertical transistor is that the channel length is not defined by lithography, but by methods such as epitaxy or layer deposition, which enable precise dimensional control. As such, vertical transistors are an attractive option for technology scaling for 5 nm and beyond.

An EPROM, or erasable programmable read-only memory, is one type of flash memory that retains its data when its power supply is switched off. Computer memory that can retrieve stored data after a power supply has been turned off and back on is called non-volatile. An EPROM is an array of floating gate transistors individually programmed by an electronic device that supplies higher voltages than those normally used in digital circuits. Once programmed, an EPROM can be erased by exposing it to a strong ultraviolet light source (such as from a mercury-vapor light). In typical EPROM cells, the floating gate transistors are formed utilizing non-vertical transistor technology. In view of the advantages with vertical transistor designs, there is a need for providing a floating gate memory (i.e., EPROM cell) using vertical transistor technology.

SUMMARY

A floating gate memory cell is provided on a surface of a base semiconductor substrate utilizing a vertical FET processing flow. The floating gate memory cell contains a bottom source/drain region located beneath one end of an epitaxial semiconductor channel material and a top source/drain region located above a second end of the epitaxial semiconductor channel material. A floating gate structure including an inner dielectric material portion, a floating gate portion, an outer dielectric material portion, and a control gate portion is present on each side of the epitaxial semiconductor channel material.

In one aspect of the present application, a semiconductor structure including a floating gate memory cell is provided. In one embodiment, the semiconductor structure includes a floating gate memory cell located above a base semiconductor substrate. The floating gate memory cell includes: a bottom source/drain semiconductor layer located above the base semiconductor substrate, an epitaxial semiconductor channel material extending upward from a topmost surface of the bottom source/drain semiconductor layer, the epitaxial semiconductor channel material having a lower portion of a first width and an upper portion of a second width that is less than the first width, a floating gate structure located on each side of the epitaxial semiconductor channel material, and a top source/drain structure extending outward from each sidewall of the upper portion of the epitaxial semiconductor channel material.

In another aspect of the present application, a method of forming a semiconductor structure including a floating gate memory cell is provided. In one embodiment, the method may include forming an epitaxial semiconductor channel material extending upward from a topmost surface of a bottom source/drain semiconductor material layer, the epitaxial semiconductor channel material having a lower portion of a first width and an upper portion of a second width that is less than the first width. Next, a top source/drain structure is formed extending outward from each sidewall of the upper portion of the epitaxial semiconductor channel material and contacting exposed portions of a topmost surface of the lower portion of the epitaxial semiconductor channel material. A floating gate structure is then formed on each side of the epitaxial semiconductor channel material.

DETAILED DESCRIPTION

Figure 1:
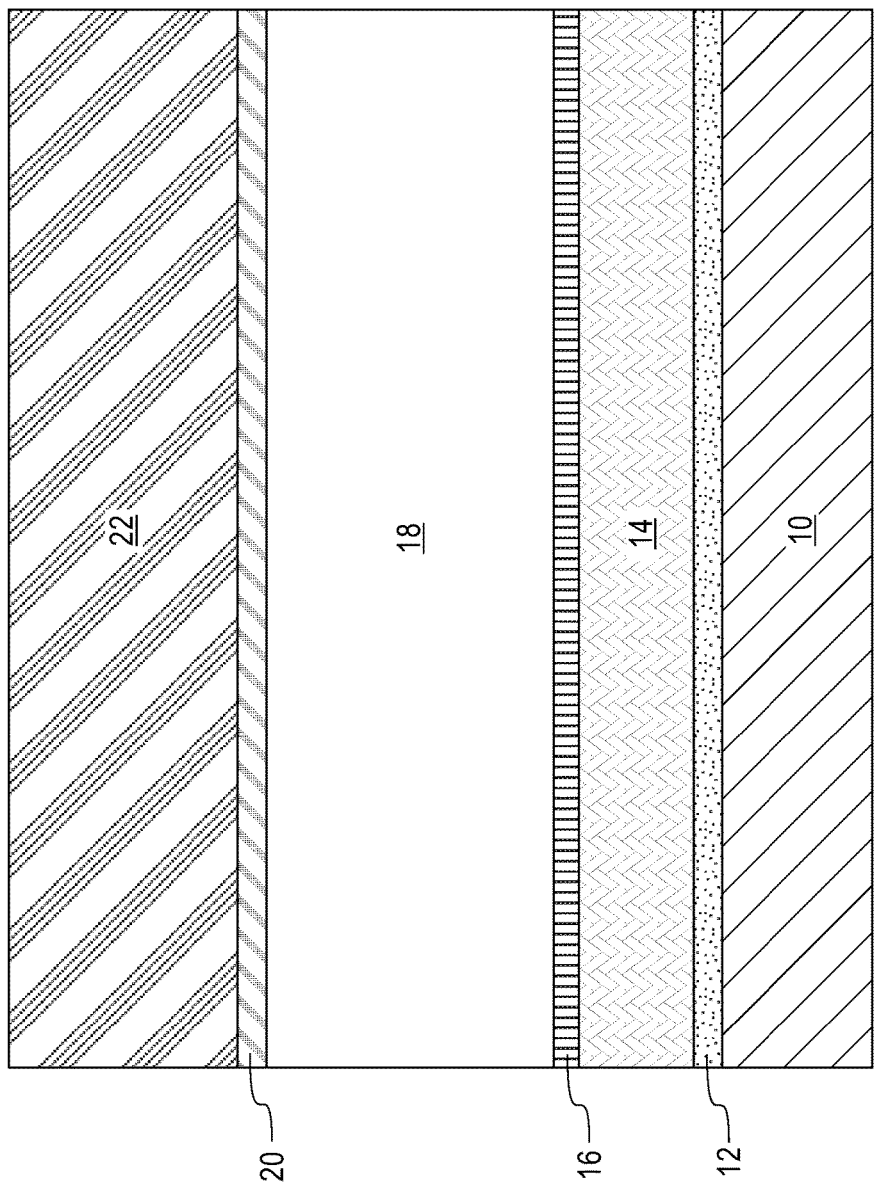
FIG. 1 is a cross sectional view of an exemplary semiconductor structure including a material stack of, from bottom to top, a semiconductor material layer of a first conductivity type, a bottom source/drain semiconductor material layer of a second conductivity type that is opposite the first conductivity type, a bottom spacer layer, a sacrificial gate material layer, a top spacer layer, and a hard mask layer, the material stack is located on a base semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in one embodiment of the present application. The exemplary semiconductor structure of FIG. 1 includes a material stack of, from bottom to top, a semiconductor material layer 12 of a first conductivity type, a bottom source/drain semiconductor material layer 14 of a second conductivity type that is opposite the first conductivity type, a bottom spacer layer 16, a sacrificial gate material layer 18, a top spacer layer 20, and a hard mask layer 22. The material stack (12, 14, 16, 18, 20, 22) is located on a base semiconductor substrate 10. In some embodiments, the semiconductor material layer 12 may be omitted.

The base semiconductor substrate 10 may include at least one semiconductor material having semiconducting properties. Examples of semiconductor materials that may provide at least a portion of the base semiconductor substrate 10 include silicon (Si), germanium (Ge), silicon germanium alloys (SiGe), silicon carbide (SiC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In one embodiment, the base semiconductor substrate 10 is a bulk semiconductor substrate. By "bulk" it is meant that the semiconductor substrate is entirely composed of at least one semiconductor material, as defined above. In one example, the base semiconductor substrate 10 may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

In another embodiment of the present application, the base semiconductor substrate 10 may comprise a topmost semiconductor material layer of a semiconductor-on-insulator (SOI) substrate. The SOI substrate would also include a handle substrate (not shown) including one of the above mentioned semiconductor materials, and an insulator layer (not shown) such as a buried oxide below the topmost semiconductor material layer.

In any of the above embodiments, the semiconductor material that provides the base semiconductor substrate 10 may be a single crystalline semiconductor material. The semiconductor material that provides the base semiconductor substrate 10 may have any of the well known crystal orientations. For example, the crystal orientation of the base semiconductor substrate 10 may be {100}, {110}, or {111}. Other crystallographic orientations besides those specifically mentioned can also be used in the present application.

The semiconductor material layer 12 of the first conductivity type may include one of the semiconductor materials mentioned above for providing the base semiconductor substrate 10. In one embodiment, the semiconductor material layer 12 may be composed of a same semiconductor material as the base semiconductor substrate 10. For example, the base semiconductor substrate 10 and the semiconductor material layer 12 may be composed of silicon. In yet another embodiment, the semiconductor material layer 12 may be composed of a different semiconductor material than the semiconductor base substrate 10. For example, the base semiconductor substrate 10 may be composed of silicon, while the semiconductor material layer 12 may be composed of a silicon germanium alloy or germanium.

The first conductivity type of the semiconductor material layer 12 may be provided by a p-type or n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In one embodiment of the present application, the concentration of n-type or p-type dopant within the semiconductor material layer 12 can range from $5\times10^{18}$ atoms/cm$^3$ to $5\times10^{19}$ atoms/cm$^3$, although dopant concentrations greater than or lesser than this range are also conceived. In one embodiment, the doping within the semiconductor material layer 12 may be uniform (i.e., have a uniform distribution of dopants throughout the entire region). In another embodiment, the doping within the semiconductor material layer 12 may be graded. The semiconductor material layer 12 is oppositely doped to the bottom source/drain semiconductor material layer 14 so as to act as a punch through stop layer.

In one embodiment of the present application, the semiconductor material layer 12 may have a thickness from 50 nm to 200 nm. Other thicknesses that are lesser than, or greater than, the aforementioned thickness range may also be employed in the present application as the thickness of the semiconductor material layer 12.

The bottom source/drain semiconductor material layer 14 of the second conductivity type may include one of the semiconductor materials mentioned above for providing the base semiconductor substrate 10. In one embodiment, the bottom source/drain semiconductor material layer 14 may be composed of a same semiconductor material as the semiconductor material layer 12 and the base semiconductor substrate 10. For example, the base semiconductor substrate 10, the semiconductor material layer 12 and the bottom source/drain semiconductor material layer 14 may all be composed of silicon. In yet another embodiment, the bottom source/drain semiconductor material layer 14 may be composed of a different semiconductor material than at least one of the semiconductor base substrate 10 or the semiconductor material layer 12. For example, the base semiconductor substrate 10 may be composed of silicon, the semiconductor material layer 12 may be composed of silicon, and the bottom source/drain semiconductor material layer 14 may be composed of a silicon germanium alloy or germanium.

The second conductivity type of the bottom source/drain semiconductor material layer 14 may be provided by a p-type or n-type dopant, as defined above, with the proviso that the second conductivity type is opposite to the first conductivity type. In one example, and when the first conductivity type is n-type, then the second conductivity type is p-type. In another example, and when the first conductivity type is p-type, then the second conductivity type is n-type.

The concentration of n-type or p-type dopant within the bottom source/drain semiconductor material layer 14 is typically greater than the concentration of dopant present in the semiconductor material layer 12. In one example, the concentration of dopant within the bottom source/drain semiconductor material layer 14 can range from $1\times10^{20}$ atoms/cm$^3$ to $2\times10^{21}$ atoms/cm$^3$.

In one embodiment of the present application, the bottom source/drain semiconductor material layer 14 may have a thickness from 20 nm to 50 nm. Other thicknesses that are lesser than, or greater than, the aforementioned thickness range may also be employed in the present application as the thickness of the bottom source/drain semiconductor material layer 14.

In one embodiment of the present application, the base semiconductor substrate 10, the semiconductor material layer 12, and the bottom source/drain semiconductor material layer 14 are formed by first providing the base semiconductor substrate 10. An epitaxial growth (or deposition) process may then be employed to form the semiconductor material layer 12 and the bottom source/drain semiconductor material layer 14. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing semiconductor material layer 12 and bottom source/drain semiconductor material layer 14, semiconductor material layer 12 and bottom source/drain semiconductor material layer 14 have an epitaxial relationship with each other as well as topmost surface of the base semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 900° C. Although higher temperature typically results in faster deposition, the faster deposition may result in crystal defects and film cracking. The epitaxial growth of semiconductor material layer 12 and bottom source/drain semiconductor material layer 14 can be performed utilizing any well known precursor gas or gas mixture. Carrier gases like hydrogen, nitrogen, helium and argon can be used. In some embodiments, a dopant that provides the specific conductivity type to the semiconductor material layer 12 and the bottom source/drain semiconductor material layer 14 may be introduced in-situ into the precursor gas or gas mixture that provides the semiconductor material layer 12 and/or the bottom source/drain semiconductor material layer 14. In another embodiment, a dopant that provides the specific conductivity type may be introduced into an intrinsic semiconductor material that can be used as semiconductor material layer 12 and/or bottom source/drain semiconductor material layer 14 by ion implantation or gas phase doping.

In another embodiment of the present application, the base semiconductor substrate 10, the semiconductor material layer 12, and the bottom source/drain semiconductor material layer 14 are formed by first providing the base semiconductor substrate 10. Dopants that provide the specific conductivity type of the semiconductor material layer 12 and/or bottom source/drain semiconductor material layer 14 may then be introduced into base semiconductor substrate 10 by ion implantation or gas phase doping.

In another embodiment of the present application, the base semiconductor substrate 10, the semiconductor material layer 12, and the bottom source/drain semiconductor material layer 14 can be formed utilizing one or more wafer bonding processes.

After providing the base semiconductor substrate 10, the semiconductor material layer 12, and the bottom source/drain semiconductor material layer 14, the bottom spacer layer 16 is formed on a topmost surface of the bottom source/drain semiconductor material layer 14. The bottom spacer layer 16 may comprise a dielectric material including, for example, silicon dioxide, silicon nitride and/or silicon oxynitride. The bottom spacer layer 16 can be formed by a deposition process such as, for example, chemical vapor deposition (CVD) or plasma enhanced chemical vapor deposition (PECVD). In other embodiments, the bottom spacer layer 16 can be formed by a thermal process such as, for example, thermal oxidation and/or thermal nitridation. In yet other embodiments, the bottom spacer layer 16 can be formed by a combination of a deposition process and a thermal process. The thickness of the bottom spacer layer 16 can range from 4 nm to 12 nm. Other thicknesses that are lesser than, or greater than, the aforementioned thickness range may also be employed as the thickness of the bottom spacer layer 16.

Next, the sacrificial gate material layer 18 is formed on a topmost surface of the bottom spacer layer 16. The sacrificial gate material layer 18 may include a material such as, for example, polysilicon or amorphous silicon. The sacrificial gate material layer 18 can be formed utilizing a deposition process including, for example, chemical vapor deposition (CVD), plasma enhanced chemical vapor deposition (PECVD), physical vapor deposition (PVD), sputtering, or atomic layer deposition (ALD). The thickness of the sacrificial gate material layer 18 can range from 50 nm to 200 nm. Other thicknesses that are lesser than, or greater than, the aforementioned thickness range may also be employed as the thickness of the sacrificial gate material layer 18.

The top spacer layer 20 is then formed on a topmost surface of the sacrificial gate material layer 18. The top spacer layer 20 may include one of the dielectric materials mentioned above for the bottom spacer layer 16. In one embodiment of the present application, the top spacer layer 20 and the bottom spacer layer 16 include a same dielectric material. For example, the top spacer layer 20 and the bottom spacer layer 16 may both be composed of silicon nitride. In another embodiment of the present application, the top spacer layer 20 and the bottom spacer layer 16 comprise different dielectric materials. For example, the top spacer layer 20 may be composed of silicon nitride, while the bottom spacer layer 16 may be composed of silicon oxynitride. The top spacer layer 20 may be formed utilizing one of the deposition processes mentioned above for forming the bottom spacer layer 16. The top spacer layer 20 may have a thickness that is within the thickness range mentioned above for the bottom spacer layer 16.

Next, the hard mask layer 22 is formed on the topmost surface of the top spacer layer 20. The hard mask layer 22 is a contiguous hard mask material that covers the entirety of the top spacer layer 20. The hard mask layer 22 that is employed in the present application may include an oxide, a nitride and/or an oxynitride, with the proviso that the hard mask layer 22 has a different etch rate than the underlying top spacer layer 20. In one example, the hard mask layer 22 may be composed of silicon dioxide, while the top spacer layer 20 may be composed of silicon nitride. The hard mask layer 22 can be formed utilizing a deposition process such as described above in forming the bottom spacer layer 16. The thickness of the hard mask layer 22 can range from 20 nm to 150 nm. Other thicknesses that are lesser than, or greater than, the aforementioned thickness range may also be employed as the thickness of the hard mask layer 22.

Figure 2:
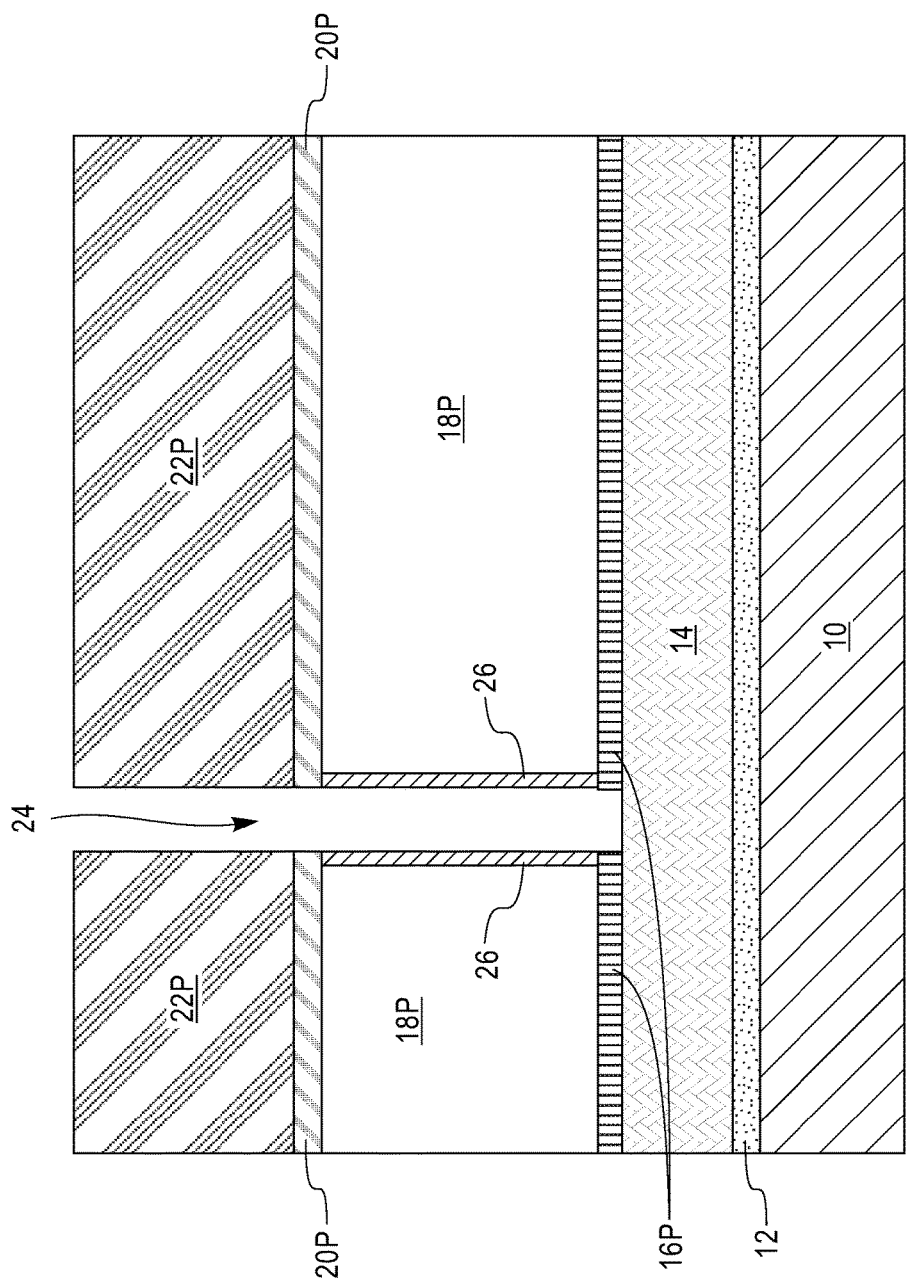
FIG. 2 is a cross sectional view of the exemplary semiconductor structure of FIG. 1 after forming an opening in the material stack, and forming an oxide liner into exposed sidewalls of each remaining portion of the sacrificial gate material layer in the opening.

Referring now to FIG. 2, there is illustrated the exemplary semiconductor structure of FIG. 1 after forming an opening 24 in the material stack, and forming an oxide liner 26 into exposed sidewalls of each remaining portion of the sacrificial gate material layer 18 (i.e., sacrificial gate material portions 18P) in the opening 24. Although a single opening 24 is described and illustrated, a plurality of openings can be formed in different portions of the material stack. These other openings may be present in a same device region as opening 24, and/or they may be present in other device regions such as, for example, logic device regions (not shown).

Opening 24 extends through the hard mask layer 22, the top spacer layer 20, the sacrificial gate material layer 18 and the bottom spacer layer 16 of the material stack shown in FIG. 1. Opening 24 exposes a portion of the topmost surface of the bottom source/drain semiconductor material layer 14.

Opening 24 may be formed by utilizing any well known patterning process. In one embodiment of the present application, the patterning process used to define opening 24 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing one or more etching process. Typically, the one or more etching processes include an anisotropic etch such as, for example, reactive ion etching.

In another embodiment, the patterning process used to define opening 24 may include a sidewall image transfer (SIT) process. In yet another embodiment, the patterning process used to define opening 24 may include a direct self-assembly (DSA) patterning process. In each of SIT and DSA, one or more anisotropic etching process can be employed.

Opening 24 that is formed can have a width from 4 nm to 12 nm. The width of opening 24 will determine the width of the channel material to be subsequently formed therein. Other widths that are lesser than or greater than the aforementioned width range may also be employed in the present application.

After forming the opening 24 portions of the hard mask layer 22, the top spacer layer 20, the sacrificial gate material layer 18, and the bottom spacer layer 16 remain laterally surrounding opening 24. Each remaining portion of the hard mask layer 22 may be referred to herein as a hard mask portion 22P, each remaining portion of the top spacer layer 20 may be referred to herein as top spacer portion 20P, each remaining portion of the sacrificial gate material layer 18 may be referred to herein as a sacrificial gate material portion 18P, and each remaining portion of the bottom spacer layer 16 may be referred to herein as a bottom spacer portion 16P.

In some embodiments of the present application, an extension implant may now be performed in opening 24 to provide a source/drain extension region (not shown) within the exposed portion of the bottom source/drain semiconductor material layer 14. In such an embodiment, the outermost edges of the source/drain extension region (not shown) are vertically aligned to the sidewall surfaces of each hard mask portion 22P, each top spacer portion 20P, each sacrificial gate material portion 18P (prior to oxide liner 26 formation), and each bottom spacer portion 16P.

Oxide liner 26 is then formed into exposed sidewalls of each remaining portion of the sacrificial gate material layer (i.e., the sacrificial gate material portions 18P) within opening 24. The oxide liner 26 can be formed utilizing an oxidation process such as, for example, a plasma oxidation process, thermal oxidation process or a chemical oxidation process. The oxidation process used to form the oxide liner 26 converts the exposed portion of each sacrificial gate material portion 18P into the oxide liner 26. The oxide liner 26 that is formed thus has a sidewall surface that is vertically aligned to the sidewall surfaces of each hard mask portion 22P, each top spacer portion 20P, and each bottom spacer 16P.

Figure 3:
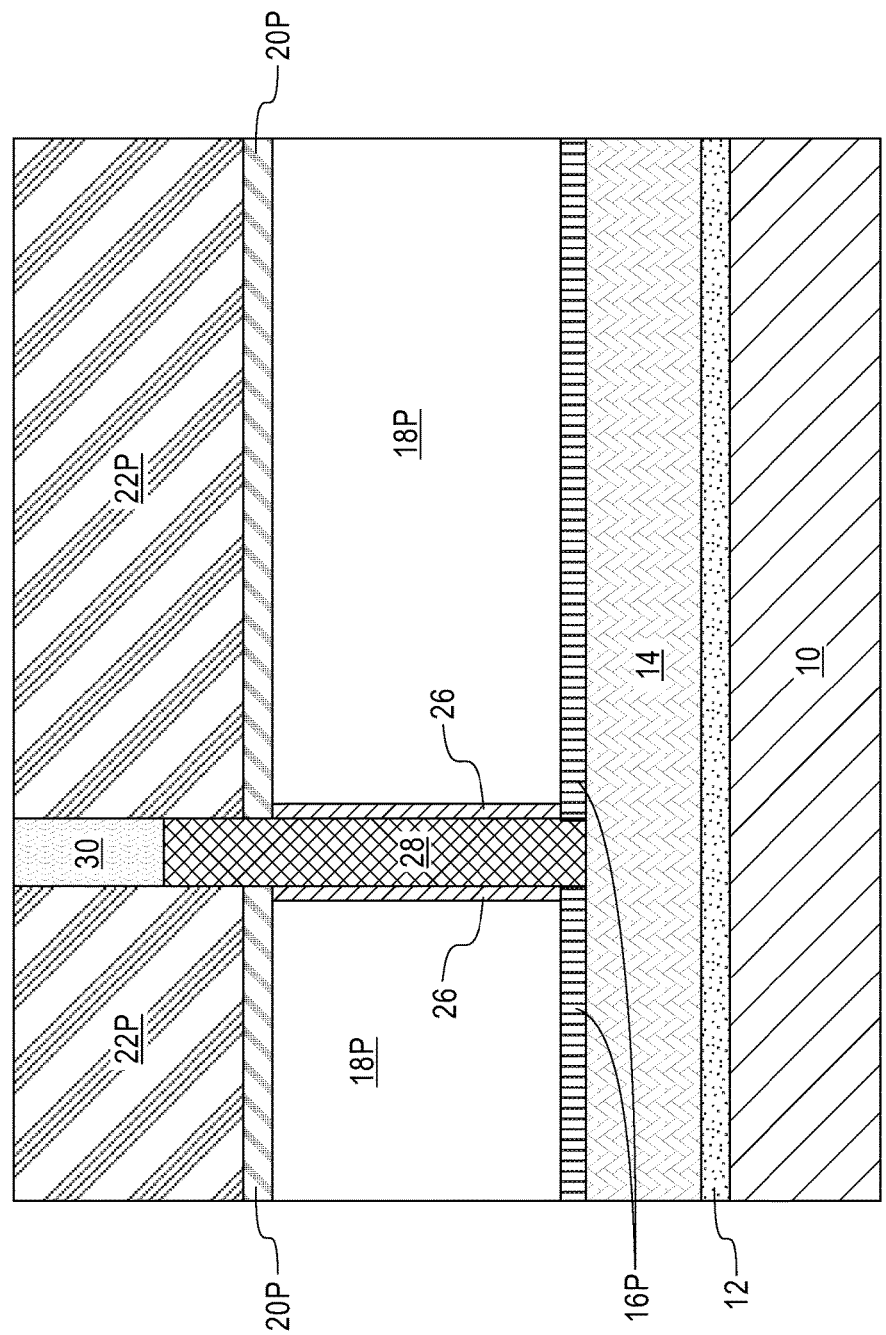
FIG. 3 is a cross sectional view of the exemplary semiconductor structure of FIG. 2 after forming an epitaxial semiconductor channel material in a portion of the opening and forming a dielectric cap on the epitaxial semiconductor channel material.

Referring now to FIG. 3, there is illustrated the exemplary semiconductor structure of FIG. 2 after forming an epitaxial semiconductor channel material 28 in a portion of the opening 24 and forming a dielectric cap 30 on the epitaxial semiconductor channel material 28.

The epitaxial semiconductor channel material 28 may include one of the semiconductor materials mentioned above for the base semiconductor substrate 10. In some embodiments, the semiconductor material that provides the epitaxial semiconductor channel material 28 may be composed of a same semiconductor material as the bottom source/drain semiconductor material layer 14. For example, the epitaxial semiconductor channel material 28 and the bottom source/drain semiconductor material layer 14 may both be composed of silicon. In another embodiment, the epitaxial semiconductor channel material 28 may be composed of a different semiconductor material than the bottom source/drain semiconductor material layer 14. For example, the epitaxial semiconductor channel material 28 may be composed of a high mobility channel material such as, for example, germanium, a silicon germanium alloy or a III-V compound semiconductor, while the bottom source/drain semiconductor material layer 14 may be composed of silicon.

The epitaxial semiconductor channel material 28 may be doped or undoped. When doped, the dopant that is present in the epitaxial semiconductor channel material 28 is of a same conductivity type (i.e., first conductivity type) as the semiconductor material layer 12. When doped, the dopant concentration in the epitaxial semiconductor channel material 28 may be from $1\times10^{15}$ atoms/cm$^3$ to $2\times10^{18}$ atoms/cm$^3$.

The epitaxial semiconductor channel material 28 may be formed utilizing an epitaxial growth (or deposition) process as defined above, followed by a recess etch. If doped, the dopant can be introduced during the epitaxial growth of the epitaxial semiconductor channel material 28. An optional planarization process such as, for example, chemical mechanical polishing (CMP), may be employed between the epitaxial growth and recess etch step. The recess etch employed is selective in removing the semiconductor material that provides the epitaxial semiconductor channel material 28. In one embodiment, recessing may be performed utilizing a timed reactive ion etch. The epitaxial semiconductor channel material 28 that is formed has a topmost surface that is located between the topmost surface and the bottommost surface of each hard mask portion 22P.

Dielectric cap 30 is then formed on a topmost surface of the epitaxial semiconductor channel material 28. The dielectric cap 30 has a different etch rate than the hard mask material that provides the hard mask layer 22. Hence, the dielectric cap 30 is composed of a different dielectric material than hard mask layer 22. In one example, the dielectric cap 30 may be composed of silicon nitride, while the hard mask layer 22 may be composed of silicon dioxide.

The dielectric cap 30 can be formed utilizing a deposition process such as, for example, chemical vapor deposition or plasma enhanced chemical vapor deposition. A planarization process such as, for example, chemical mechanical polishing (CMP), may follow the deposition of the dielectric material that provides the dielectric cap 30. As is shown, sidewall surfaces of the dielectric cap 30 are vertically aligned with the sidewall surfaces of the underlying epitaxial semiconductor channel material 28.

Figure 4:
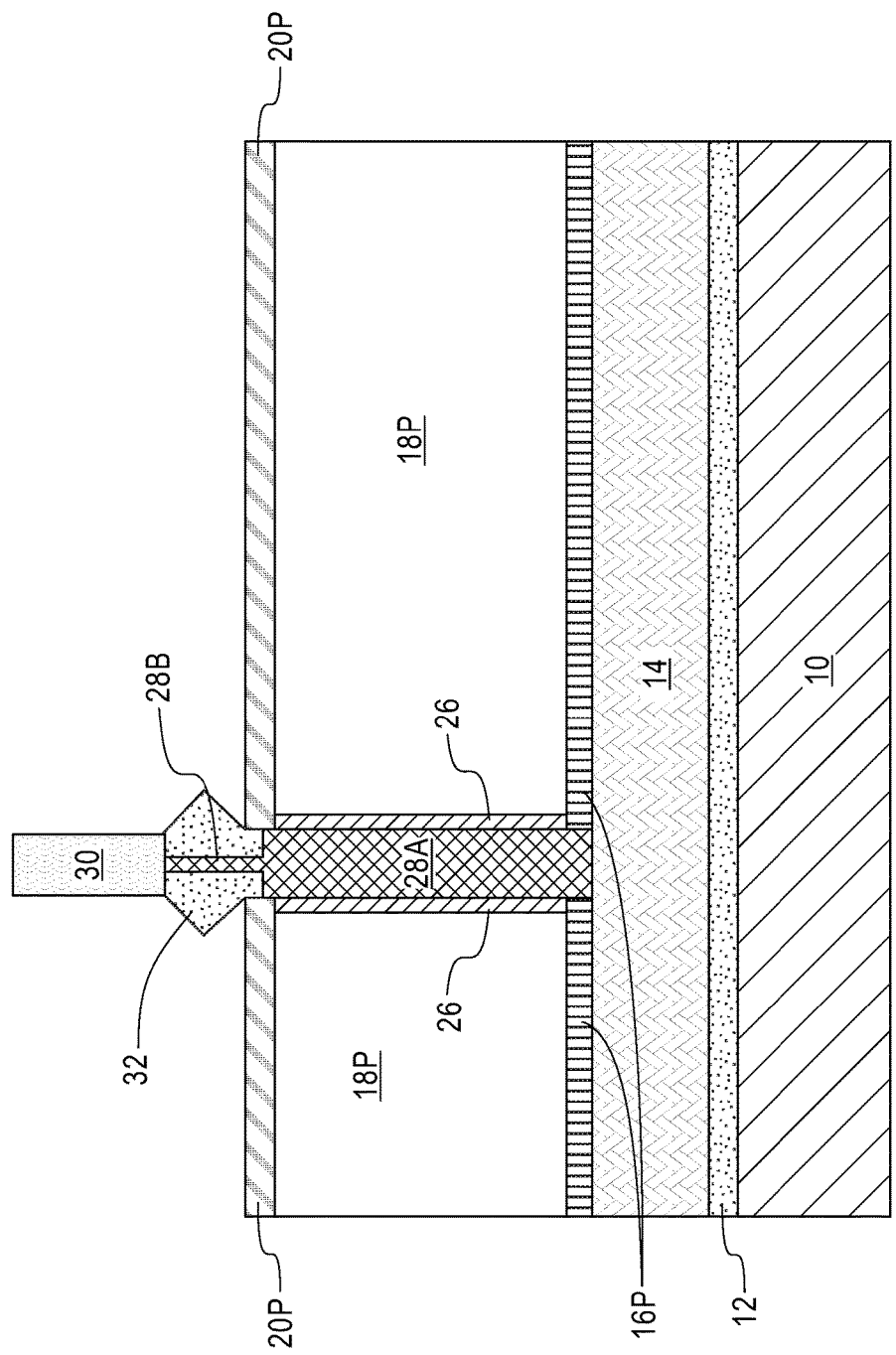
FIG. 4 is a cross sectional view of the exemplary semiconductor structure of FIG. 3 after removing remaining portions of the hard mask layer, laterally etching an exposed portion of the epitaxial semiconductor channel material, and epitaxially growing a top source/drain structure from each recessed sidewall of an upper portion of the epitaxial semiconductor channel material.

Referring now to FIG. 4, there is illustrated the exemplary semiconductor structure of FIG. 3 after removing remaining portions of the hard mask layer (i.e., hard mask portions 22P), laterally etching an exposed portion of the epitaxial semiconductor channel material 28, and epitaxially growing a top source/drain structure 32 from each recessed sidewall of an upper portion 28B of the epitaxial semiconductor channel material 28.

Each hard mask portion 22P may be removed utilizing an etching process that is selective in removing the hard mask material that provides the hard mask layer 22 stopping on each top spacer portion 20P. In one example, and when the hard mask portions 22P are composed of silicon dioxide, aqueous hydrofluoric acid may be employed as an etchant. The removal of each hard mask portion 22P exposes an upper portion of the epitaxial semiconductor channel material 28. The exposed upper portion of the epitaxial semiconductor channel material 28 is then subjected to a lateral etch (i.e., recessing) process to provide an upper portion 28B of the epitaxial semiconductor channel material 28 whose width is less than the non-etched portion (i.e., lower portion 28A) of the epitaxial semiconductor channel material 28.

Next, the top source/drain structure 32 is epitaxially grown from each exposed sidewall surface of the upper portion 28B of the epitaxial semiconductor channel material 28. The epitaxial growth (or deposition) used to provide each top source/drain structure 32 is as defined above. Each top source/drain structure 32 includes a semiconductor material and a dopant (n-type or p-type) as defined above. The dopant, which is of the same conductivity type as the bottom source/drain semiconductor material layer 14, can be added during the epitaxial growth of the semiconductor material that provides each top source/drain structure 32 or after epitaxially depositing an intrinsic semiconductor material utilizing a gas phase doping process. The dopant can be present in each top source/drain structure 32 in a range as mentioned above for the bottom source/drain semiconductor material layer 14. The semiconductor material that provides the each top source/drain structure 32 may be the same as, or different from, the semiconductor material that provides the epitaxial semiconductor channel material 28.

In some embodiments, and as shown, each top source/drain structure 32 may have faceted surfaces, i.e., non-planar surfaces. In some embodiments and as shown, each top source/drain structure 32 is triangular in shape, wherein the base of the triangle directly contacts one of the sidewalls of the upper portion 28B of the epitaxial semiconductor channel material 28 and the tip of the triangle extends outward from the one sidewall of the upper portion 28B of the epitaxial semiconductor channel material 28. In some embodiments, and as shown, the tip of each triangle may extend beyond the sidewall surfaces of the epitaxial semiconductor channel material 28.

During the epitaxial growth process and as shown, a portion of each top source/drain structure 32 may contact an exposed topmost surface of the lower portion 28A of the epitaxial semiconductor channel material 28; epitaxial growth is prevented from the topmost surface of the upper portion 28B of the epitaxial semiconductor channel material 28 due to the presence of the dielectric cap 30.

Figure 5:
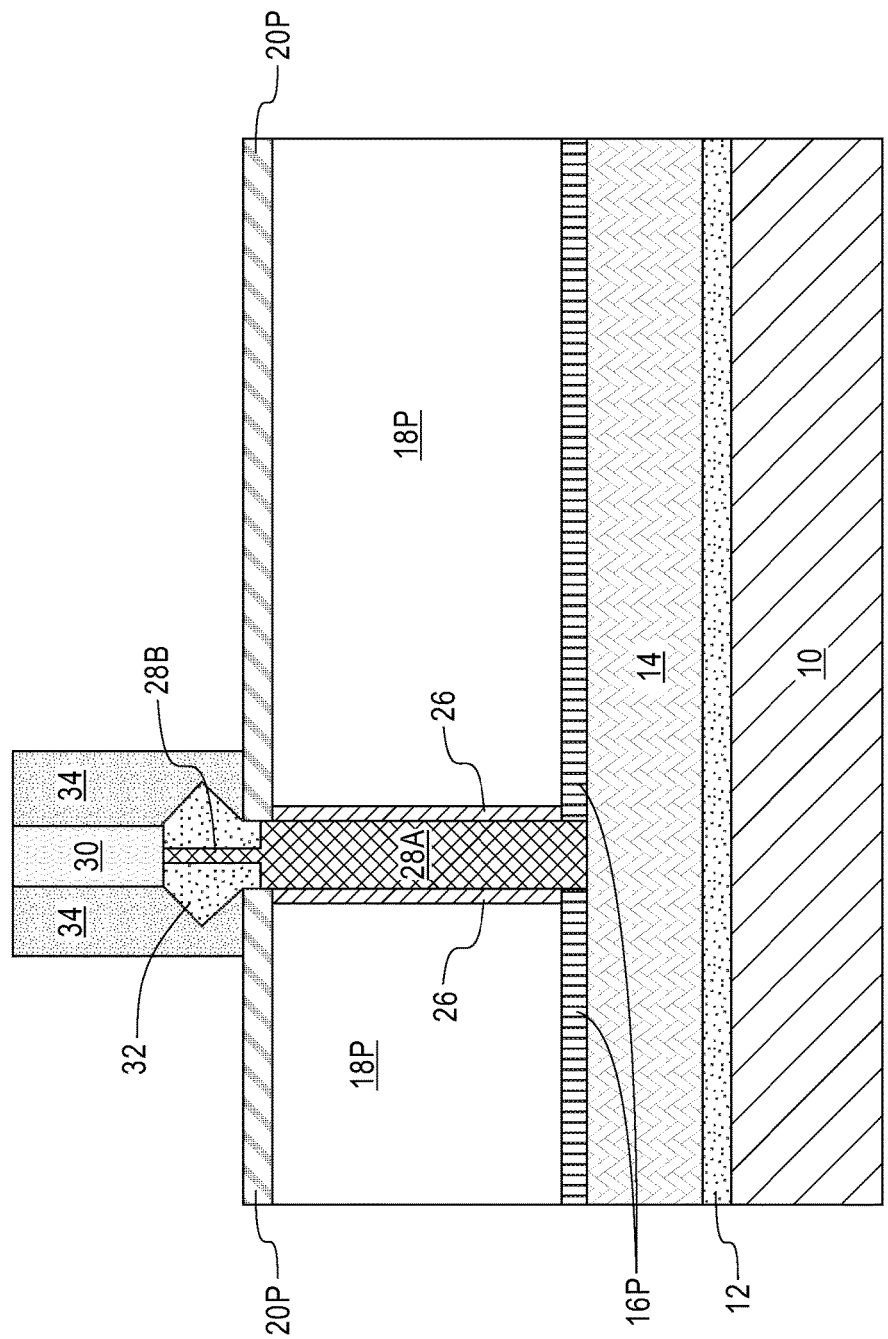
FIG. 5 is a cross sectional view of the exemplary semiconductor structure of FIG. 4 after forming a dielectric spacer protecting each top source/drain structure.

Referring now to FIG. 5, there is illustrated the exemplary semiconductor structure of FIG. 4 after forming a dielectric spacer 34 protecting each source/drain structure 32. Each dielectric spacer 34 may include any dielectric spacer material including, for example, silicon dioxide, silicon nitride and/or silicon oxynitride. The dielectric spacer material that provides the dielectric spacer 34 is composed of a different material than at least the top spacer layer 20. Each dielectric spacer 34 may be formed utilizing a deposition process, followed by a spacer etch.

Figure 6:
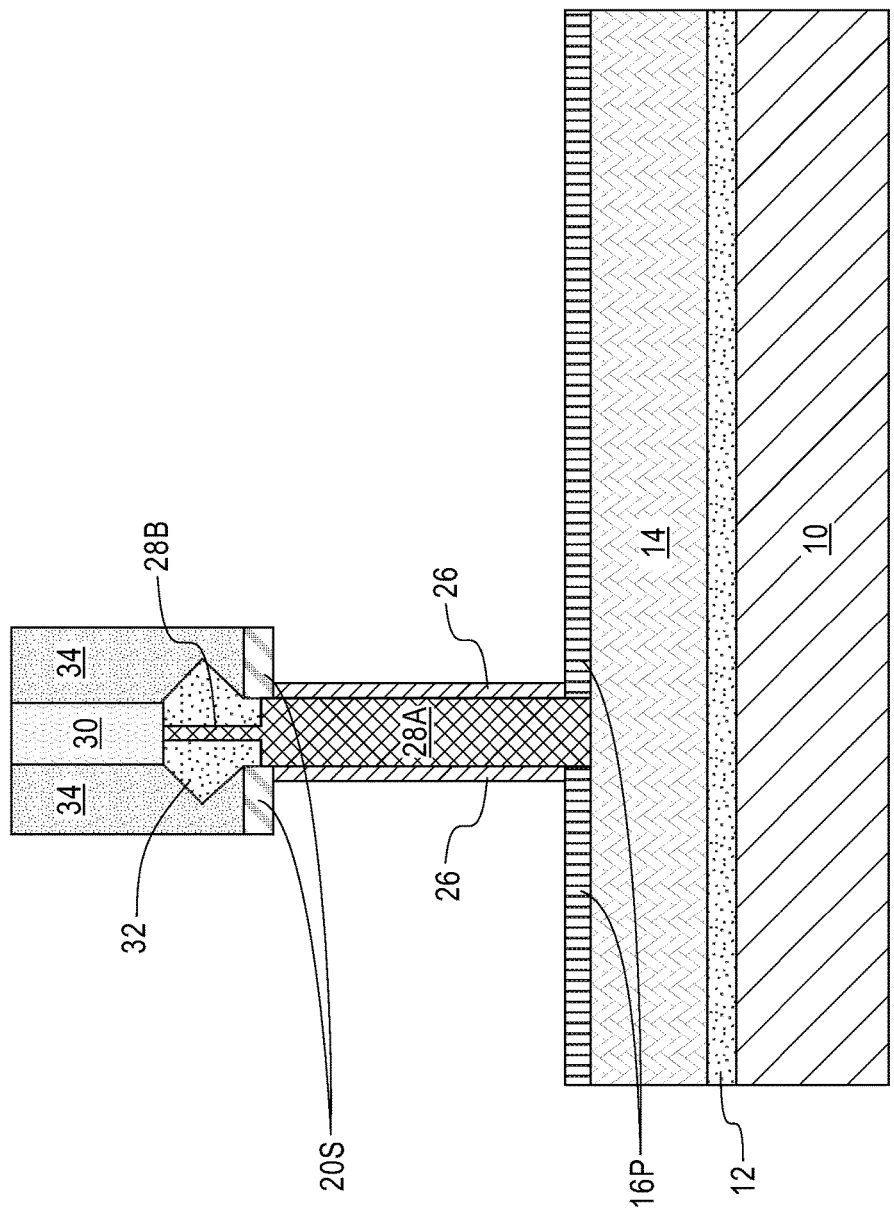
FIG. 6 is a cross sectional view of the exemplary semiconductor structure of FIG. 5 after removing each top spacer portion that is not protected by the dielectric spacer and then removing remaining portions of the sacrificial gate material layer.

Referring now to FIG. 6, there is illustrated the exemplary semiconductor structure of FIG. 5 after removing each top spacer portion 20P that is not protected by the dielectric spacer 34 and then removing remaining portions of the sacrificial gate material layer (i.e., each sacrificial gate material portion 18P).

The removal of the top spacer portion 20P that is not protected by the dielectric spacer 34 can be performed utilizing an anisotropic etch. As is shown, portions of each top spacer portion 20P remain beneath each dielectric spacer 34. Each remaining portion of the top spacer portion 20P may be referred to herein as a top spacer structure 20S. As is shown, an outermost sidewall surface of each top spacer structure 20S is vertically aligned to the outermost sidewall surface of the overlying dielectric spacer 34.

The sacrificial gate material portions 18P may be removed utilizing a single etching process or a combination of etching processes may be used. The removal of each sacrificial gate material portion 18P exposes a topmost surface of each bottom spacer portion 16P and an outer sidewall of the oxide liner 26.

Figure 7:
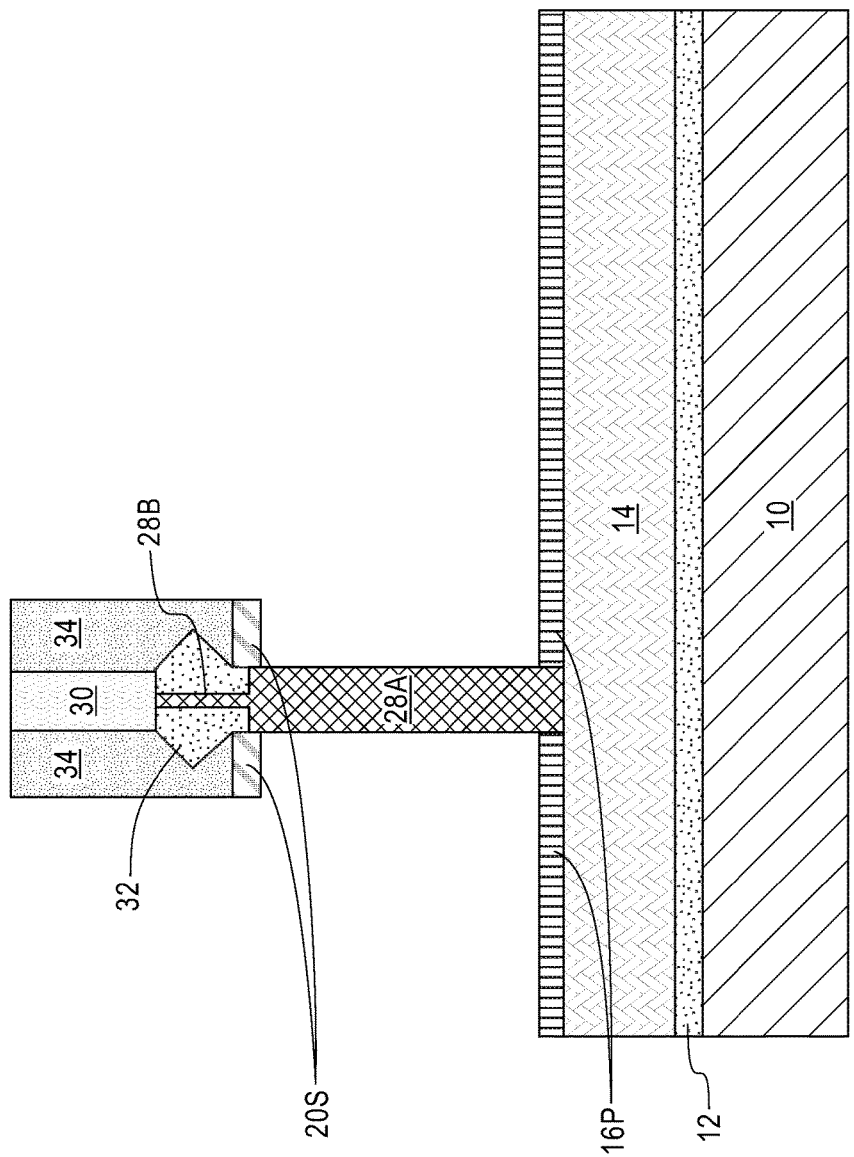
FIG. 7 is a cross sectional view of the exemplary semiconductor structure of FIG. 6 after removing the oxide liner from each sidewall of a lower portion of the epitaxial semiconductor channel material.

Referring now to FIG. 7, there is illustrated the exemplary semiconductor structure of FIG. 6 after removing the oxide liner 26 from each sidewall of the lower portion 28A of the epitaxial semiconductor channel material 28. The removal of the oxide liner 26 may be performed utilizing an etching process that is selective in removing the oxide liner 26. In one embodiment of the present application, the oxide liner 26 may be removed utilizing aqueous hydrofluoric acid as an etchant. The removal of the oxide liner 26 exposes the sidewall surfaces of the lower portion 28A of the epitaxial semiconductor channel material 28.

Figure 8:
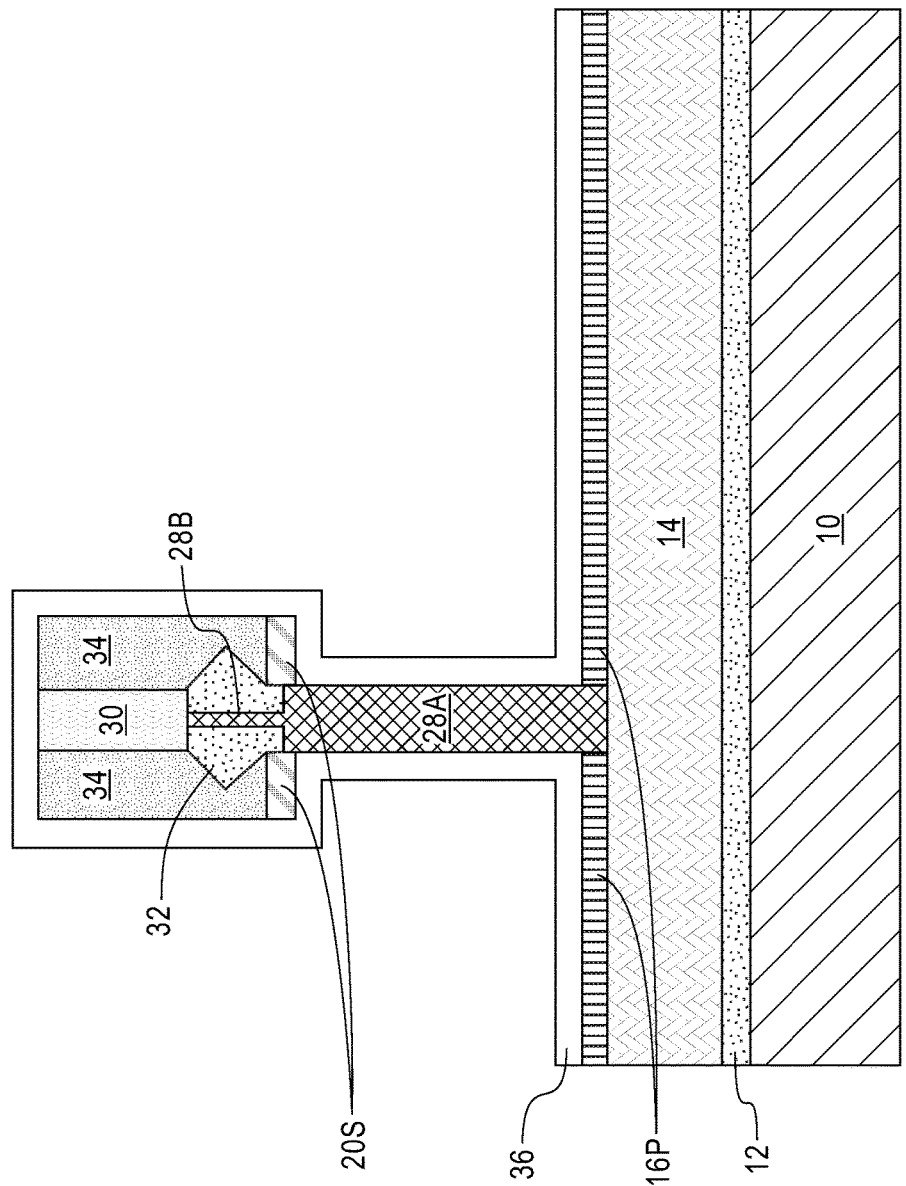
FIG. 8 is a cross sectional view of the exemplary semiconductor structure of FIG. 7 after forming a continuous layer of a first dielectric material.

Referring now to FIG. 8, there is illustrated the exemplary semiconductor structure of FIG. 7 after forming a continuous layer of a first dielectric material 36. The continuous layer of first dielectric material 36 is formed above the bottom source/drain semiconductor material layer 14 and surrounding the epitaxial semiconductor channel material (28A, 28B) and each top source/drain structure 32. More particularly, the continuous layer of first dielectric material 36 is formed directly on exposed surfaces of each bottom spacer portion 16P, on exposed sidewall surfaces of the lower portion 28A of the epitaxial semiconductor channel material 28, on exposed surfaces of each top spacer structure 20S, and exposed surfaces of each dielectric spacer 34.

The continuous layer of first dielectric material 36 has a first thickness. The first thickness of the continuous layer of first dielectric material 36 may be from 0.5 nm to 3 nm. The continuous layer of first dielectric material 36 may include any gate dielectric material; the continuous layer of first dielectric material 36 has a different composition than the bottom and top spacer layers (16, 20), the dielectric spacer 34, and the dielectric cap 30.

The continuous layer of first dielectric material 36 may include a dielectric oxide, dielectric nitride, and/or dielectric oxynitride. In one example, the continuous layer of first dielectric material 36 can be composed of a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the continuous layer of first dielectric material 36. The dielectric material used in providing the continuous layer of first dielectric material 36 can be formed by any deposition process including, for example, chemical vapor deposition (CVD), plasma enhanced chemical vapor deposition (PECVD), physical vapor deposition (PVD), sputtering, or atomic layer deposition (ALD).

Figure 9:
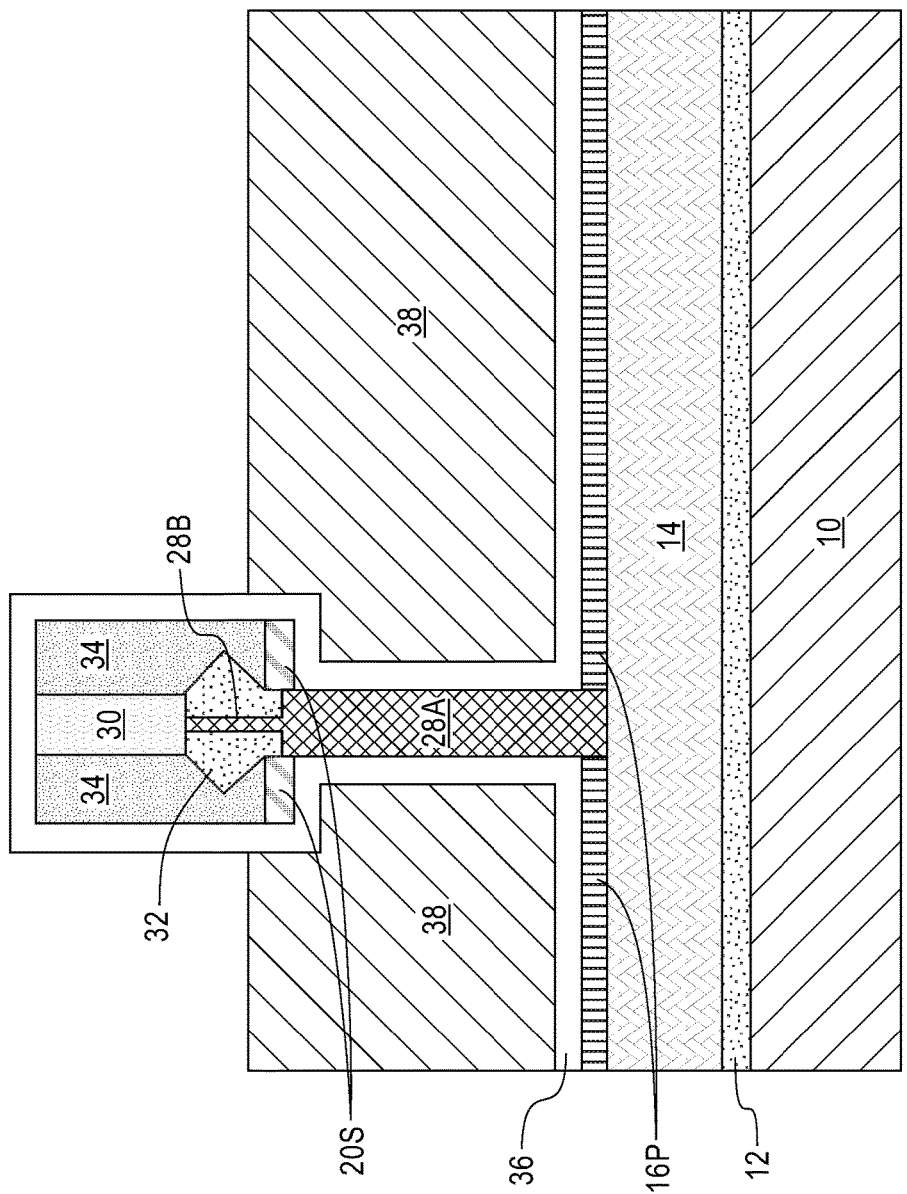
FIG. 9 is a cross sectional view of the exemplary semiconductor structure of FIG. 8 after forming a floating gate material on each side of the epitaxial semiconductor channel material.

Referring now to FIG. 9, there is illustrated the exemplary semiconductor structure of FIG. 8 after forming a floating gate material 38 on each side of the epitaxial semiconductor channel material 28 and on a surface of continuous layer of first dielectric material 36. In some embodiments, the floating gate material 38 may be composed of a metal (such as, for example, aluminum (Al), copper, (Cu), tungsten (W). In other embodiments, the floating gate material 38 may be composed of polysilicon or amorphous silicon. In yet other embodiments, the floating gate material 38 may be composed of a dielectric material whose composition differs from the composition of the continuous layer of first dielectric material 36 as well as the continuous layer of second dielectric material 40 to be subsequently formed. The floating gate material 38 may be formed by depositing one of the above mentioned "floating gate" materials utilizing any conventional deposition process such as, for example, chemical vapor deposition or plasma enhanced chemical vapor deposition. A planarization process and/or a recess etch may follow the deposition of the one of the above mentioned "floating gate" materials. The floating gate material 38 may have a topmost surface that is located between a topmost and a bottommost surface of the upper portion 28B of the epitaxial semiconductor channel material 28.

Figure 10:
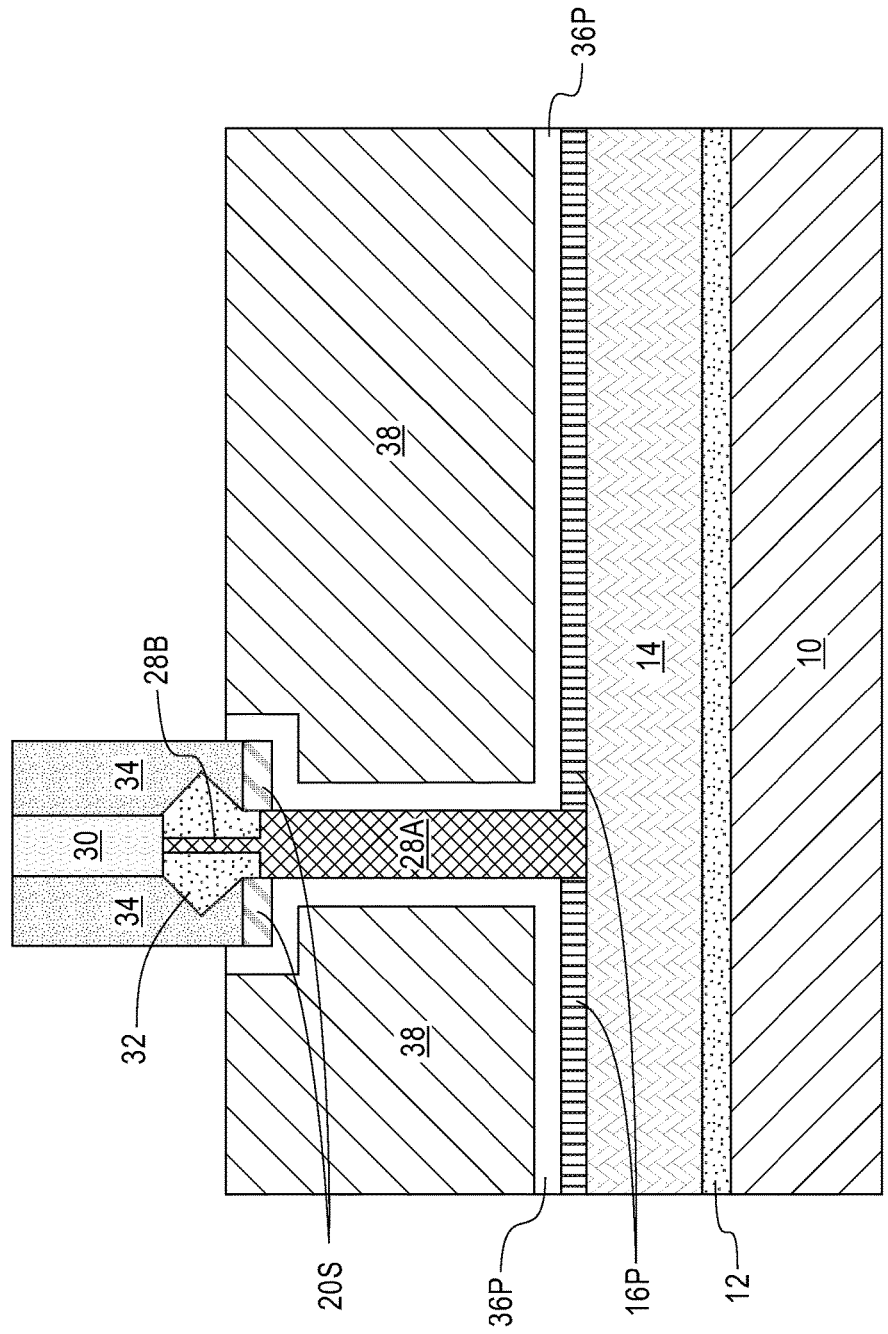
FIG. 10 is a cross sectional view of the exemplary semiconductor structure of FIG. 9 after patterning the continuous layer of first dielectric material to provide an inner dielectric material liner on each side of the epitaxial semiconductor channel material.

Referring now to FIG. 10, there is illustrated the exemplary semiconductor structure of FIG. 9 after patterning the continuous layer of first dielectric material 36 to provide an inner dielectric material liner 36P on each side of the epitaxial semiconductor channel material 28. Each inner dielectric material liner 36P has a topmost surface that is coplanar with a topmost surface of each floating gate material 38. The patterning of the continuous layer of first dielectric material 36 may be performed utilizing an etch such as, for example, reactive ion etching that is selective in removing the dielectric material that provides the continuous layer of first dielectric material 36.

Figure 11:
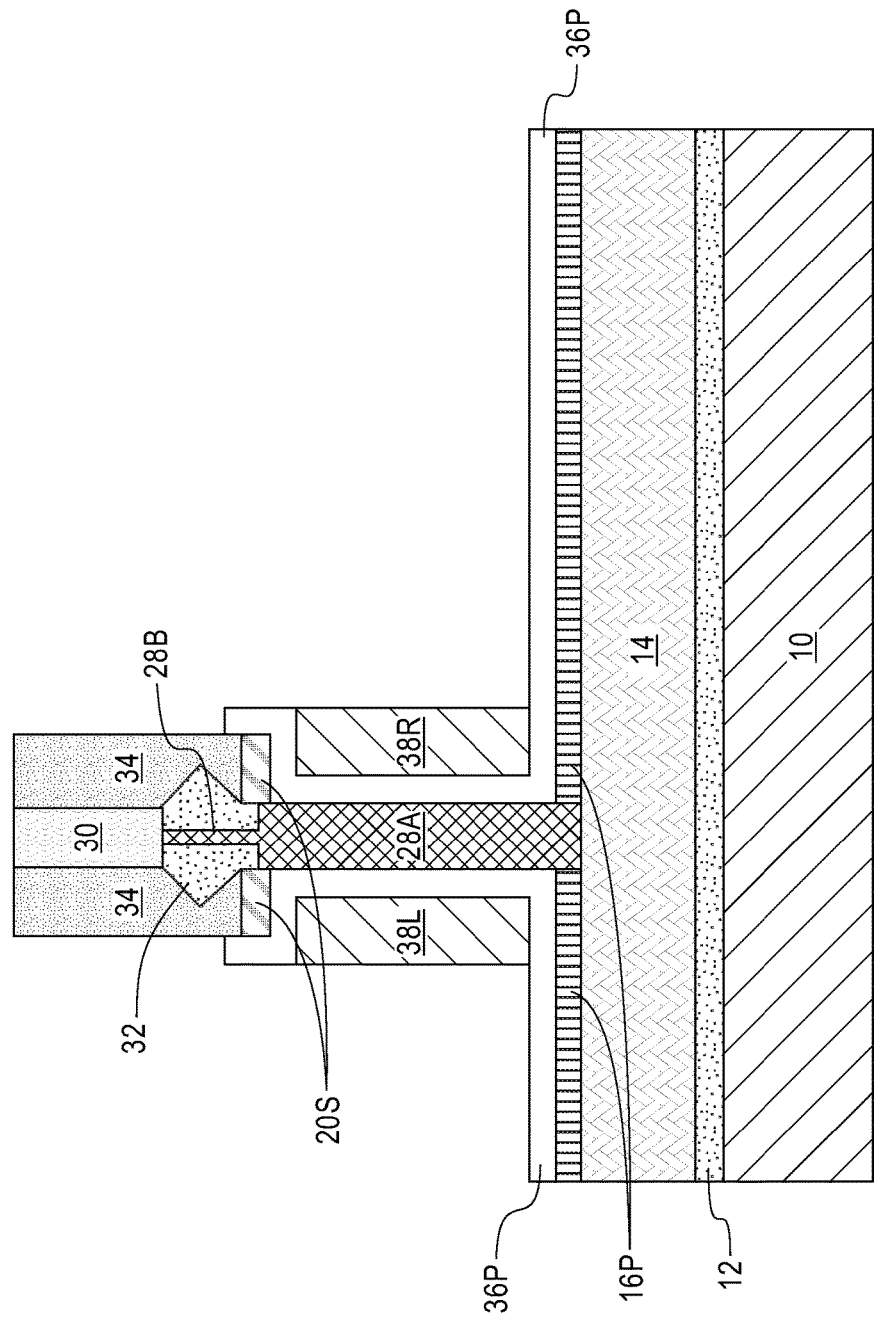
FIG. 11 is a cross sectional view of the exemplary semiconductor structure of FIG. 10 after patterning each floating gate material portion to provide a floating gate portion on each side of the epitaxial semiconductor channel material.

Referring now to FIG. 11, there is illustrated the exemplary semiconductor structure of FIG. 10 after patterning each floating gate material 38 to provide a floating gate portion 38L, 38R on each side of the epitaxial semiconductor channel material 28. As is shown, each floating gate portion 38L, 38R has a bottommost surface, a topmost surface and one sidewall surface that are in direct contact with a portion of the inner dielectric material liner 36P. The patterning of each floating gate material 38 may be performed utilizing an etch such as, for example, reactive ion etching that is selective in removing the material that provides each floating gate material portion 38. Collectively, the dielectric spacers 34, the dielectric cap 30 and the inner dielectric material liner 36P are employed as an etch mask during the patterning of each floating gate material 38.

Figure 12:
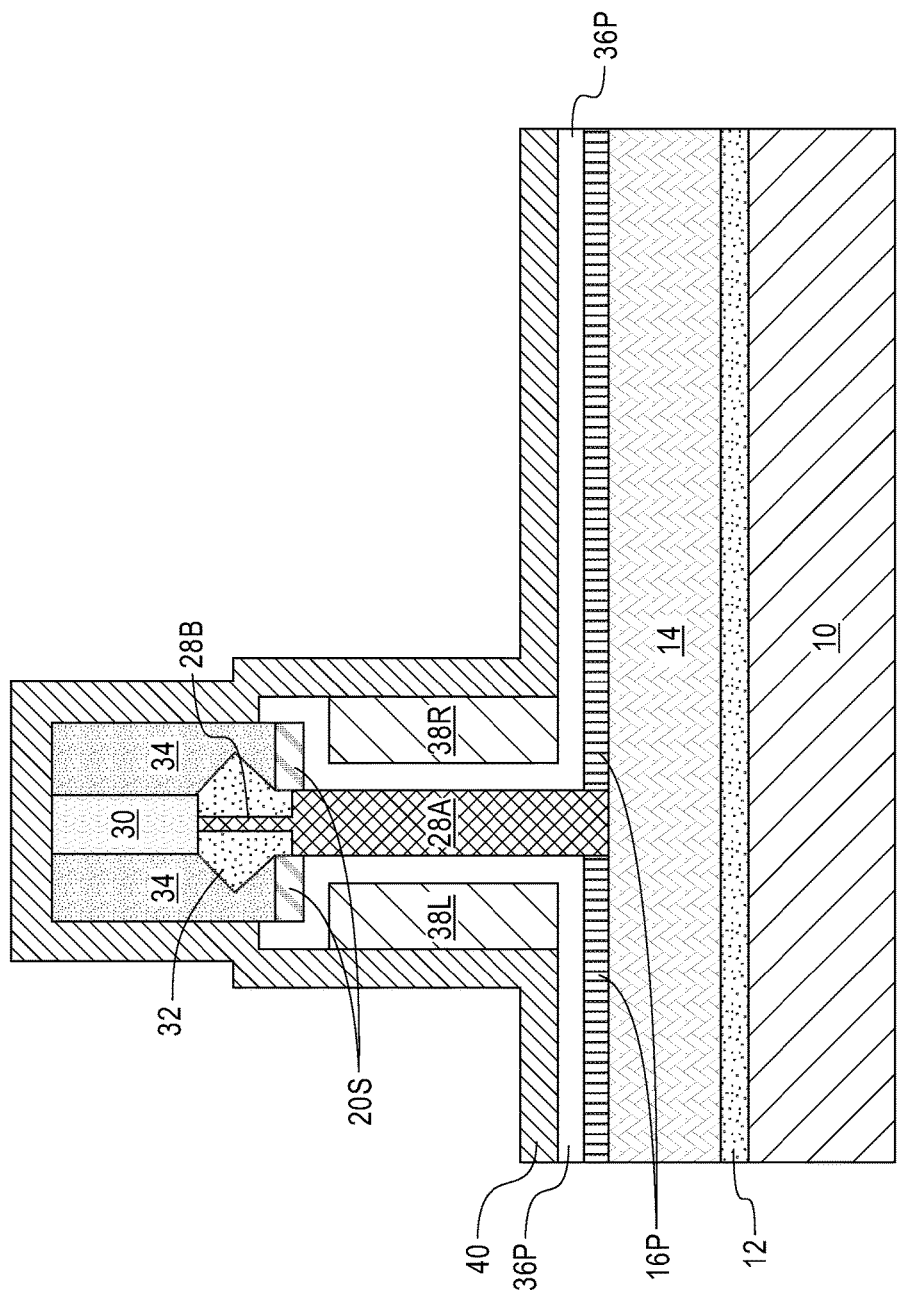
FIG. 12 is a cross sectional view of the exemplary semiconductor structure of FIG. 11 after forming a continuous layer of a second dielectric material.

Referring now to FIG. 12, there is illustrated the exemplary semiconductor structure of FIG. 11 after forming a continuous layer of a second dielectric material 40. The continuous layer of second dielectric material 40 surrounds the epitaxial semiconductor channel material (28A, 28B) and is located on exposed surfaces of each inner dielectric material liner 36P and each floating gate portion 38L, 38R; each floating gate portion 38L, 38R is encased by the continuous layer of second dielectric material 40 and the inner dielectric material liner 36P. The continuous layer of second dielectric material 40 also surrounds each top source/drain structure 32 and is present on exposed surfaces of the dielectric spacers 34 and dielectric cap 30.

The continuous layer of second dielectric material 40 may include one of the gate dielectric materials mentioned above for the continuous layer of first dielectric material 36. In one embodiment, the continuous layer of second dielectric material 40 may be composed of a same gate dielectric material as the continuous layer of first dielectric material 36. In another embodiment, the continuous layer of second dielectric material 40 may be composed of a different gate dielectric material than the continuous layer of first dielectric material 36.

The continuous layer of second dielectric material 40 has a second thickness that is typically greater than the first thickness mentioned above for the continuous layer of the first dielectric material 36. In one example, the second thickness of the continuous layer of second dielectric material 40 is from 2 nm to 8 nm. The continuous layer of second dielectric material 40 may be formed utilizing one of the deposition processes mentioned above for forming the continuous layer of first dielectric material 36.

Figure 13:
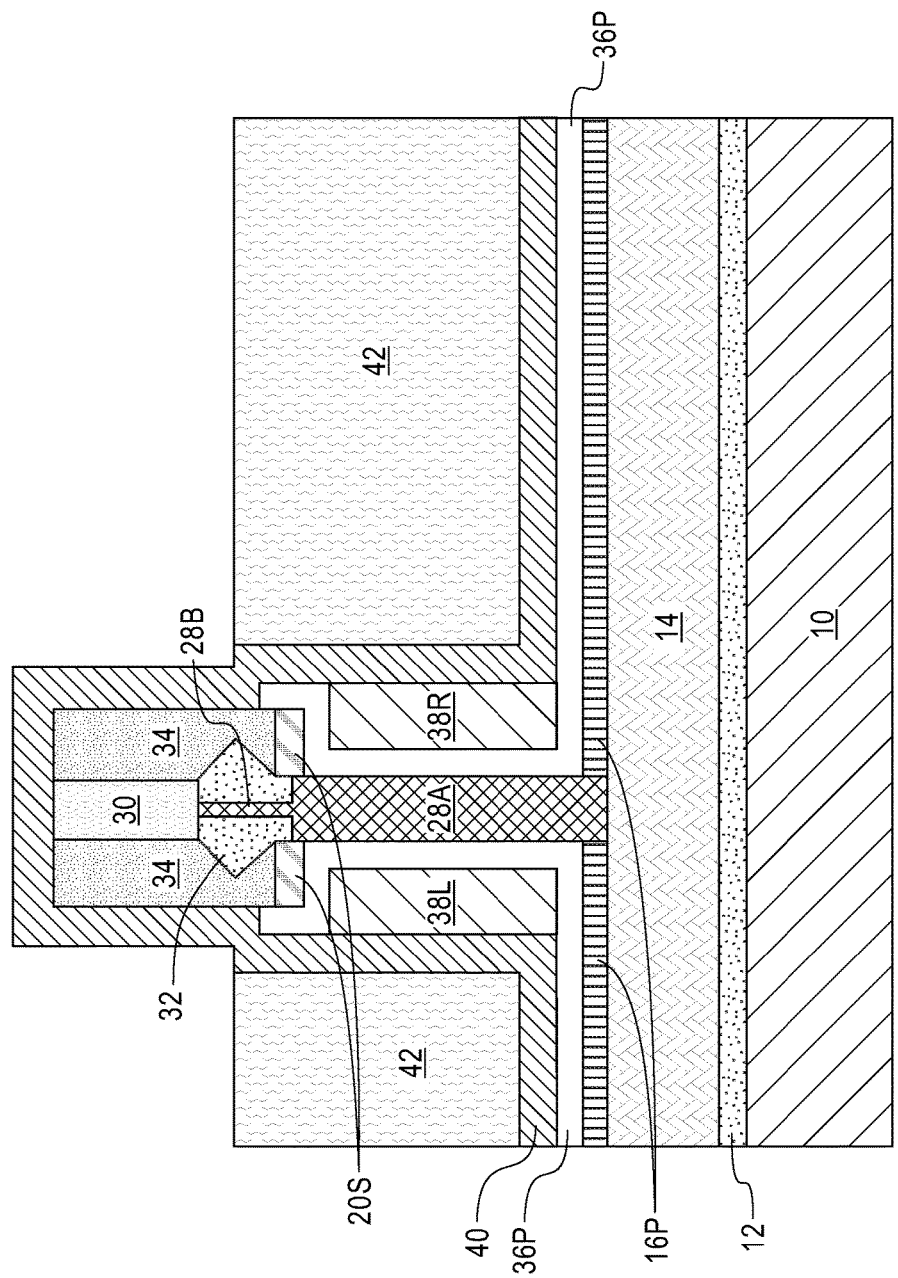
FIG. 13 is a cross sectional view of the exemplary semiconductor structure of FIG. 12 after forming a control gate material on each side of the epitaxial semiconductor channel material.

Referring now to FIG. 13, there is illustrated the exemplary semiconductor structure of FIG. 12 after forming a control gate material 42 on each side of the epitaxial semiconductor channel material 28. The control gate material 42 has a topmost surface that is located above a topmost surface of each floating gate portion 38L, 38R and between the topmost surface and bottommost surface of the upper portion 28B of the epitaxial semiconductor channel material 28.

The control gate material 42 includes a gate conductor material. The gate conductor material used in providing the control gate material 42 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the control gate material 42 may be composed of an nFET gate metal. In another embodiment, the control gate material 42 may be composed of a pFET gate metal. The gate conductor material used in providing the control gate material 42 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. A planarization process and/or a recess etch may follow the deposition of the gate conductor material used in providing the control gate material 42.

Figure 14:
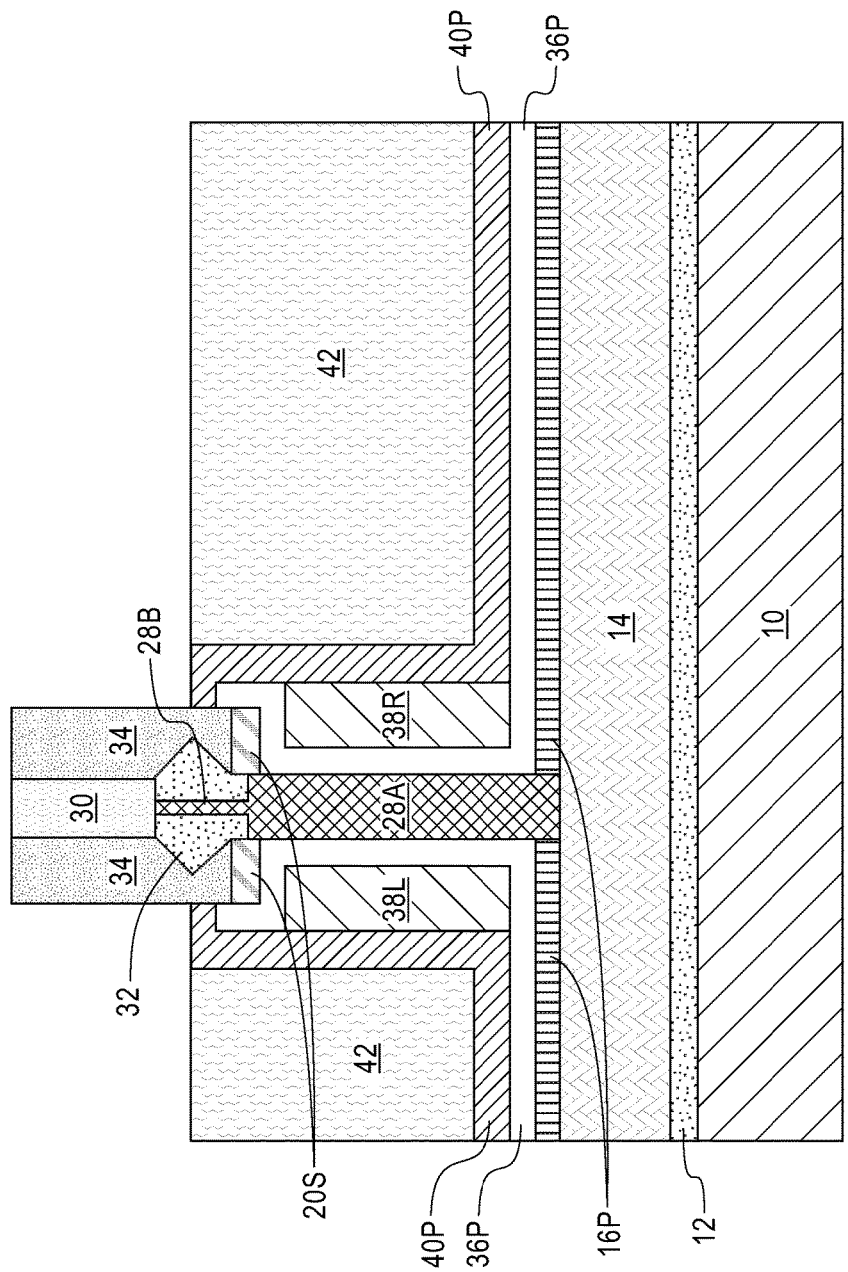
FIG. 14 is a cross sectional view of the exemplary semiconductor structure of FIG. 13 after patterning the continuous layer of second dielectric material to provide an outer dielectric material liner on each side of the epitaxial semiconductor channel material.

Referring now to FIG. 14, there is illustrated the exemplary semiconductor structure of FIG. 13 after patterning the continuous layer of second dielectric material 40 to provide an outer dielectric material liner 40P on each side of the epitaxial semiconductor channel material 28. Each floating gate portion 38L, 38R is now encased by the outer dielectric material liner 40P and the inner dielectric material liner 36P. The patterning of the continuous layer of second dielectric material 40 may be performed utilizing an etch such as, for example, reactive ion etching that is selective in removing the dielectric material that provides the continuous layer of second dielectric material 40.

Figure 15:
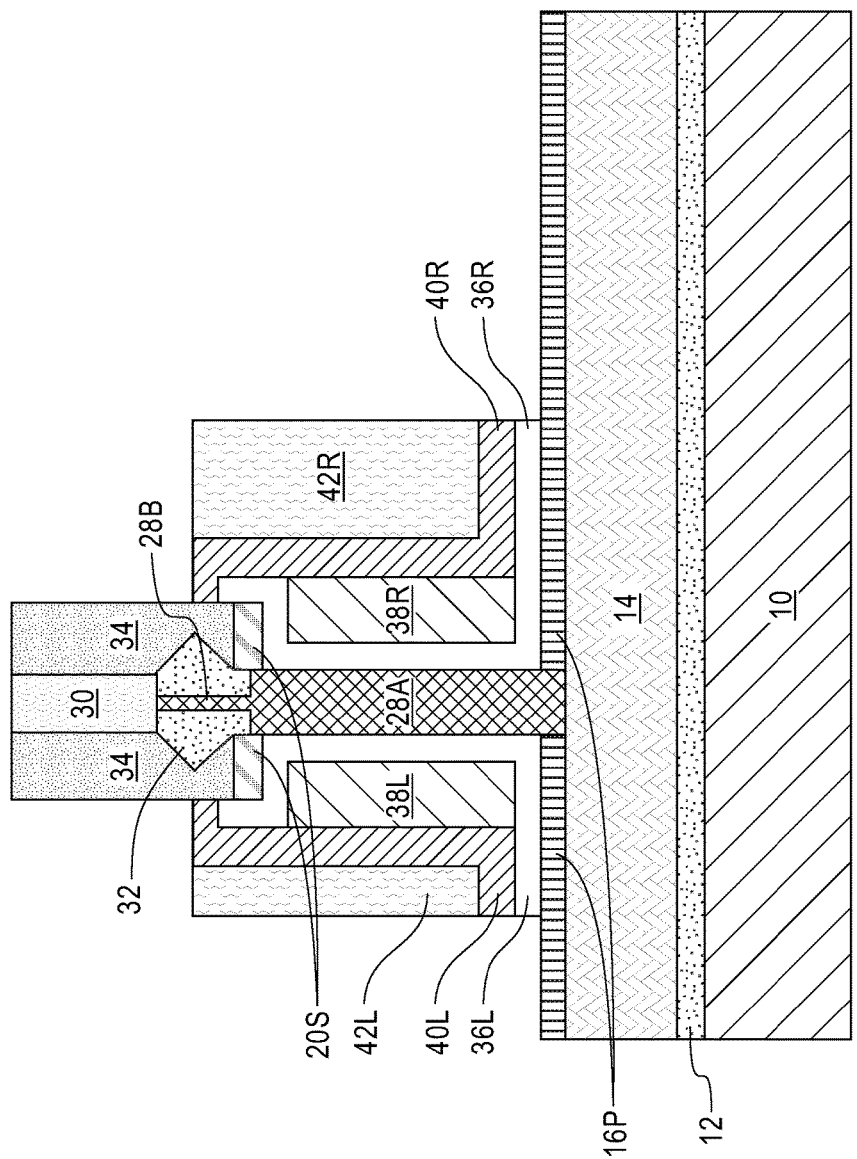
FIG. 15 is a cross sectional view of the exemplary semiconductor structure of FIG. 14 after patterning the control gate material to provide a control gate portion on each side of the epitaxial semiconductor channel material, wherein during the patterning portions of each inner dielectric material liner and portions of each outer dielectric material liner are removed to provide an inner dielectric material portion and an outer dielectric material portion on each side of the epitaxial semiconductor channel material.

Referring now to FIG. 15, there is illustrated the exemplary semiconductor structure of FIG. 14 after patterning the control gate material 42 to provide a control gate portion 42L, 42R on each side of the epitaxial semiconductor channel material 28, wherein during the patterning portions of each inner dielectric material liner 36P and portions of each outer dielectric material liner 40P are removed to provide an inner dielectric material portion 36L, 36R and an outer dielectric material portion 40L, 40R on each side of the epitaxial semiconductor channel material 28. Each floating gate portion 38L, 38R is now encased by the outer dielectric material portion 40L, 40R and the inner dielectric material portion 36L, 36R. The patterning of each control gate material 42 may be performed by lithography and etching are employed as an etch mask during the patterning of each control gate material 42. After patterning, each control gate portion 42L, 42R has a topmost surface that is coplanar with a topmost surface of the outer dielectric material portion 40L, 40R.

Figure 16:
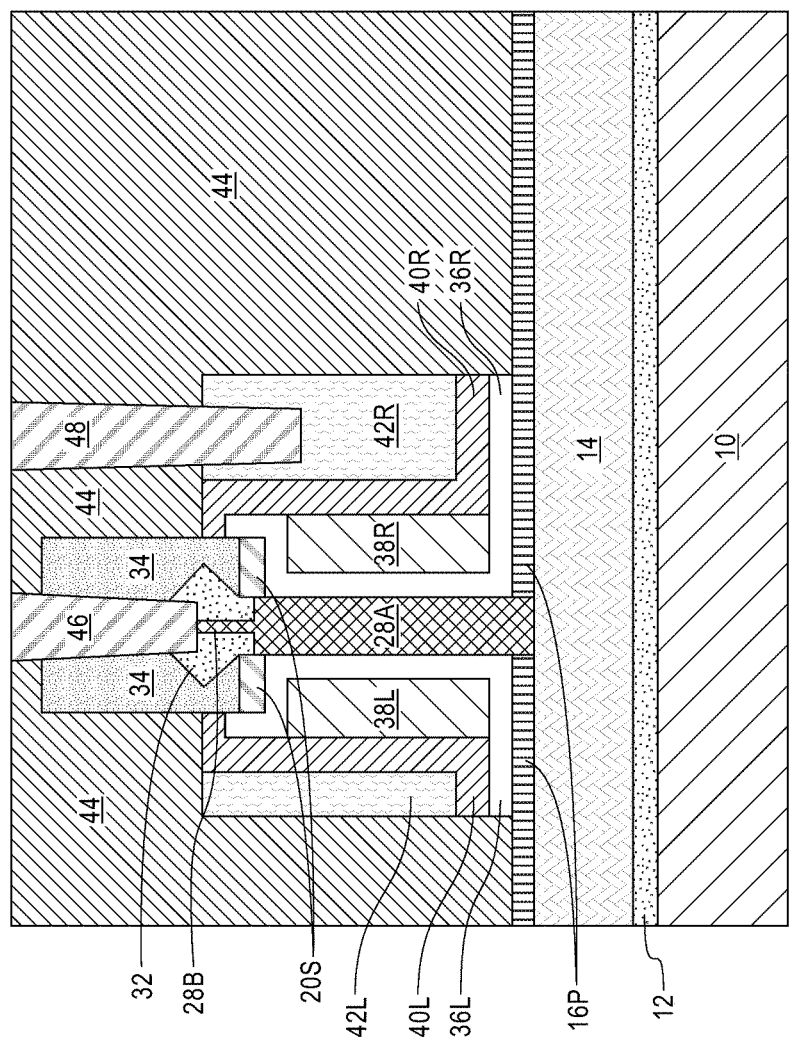
FIG. 16 is a cross sectional view of the exemplary semiconductor structure of FIG. 15 after forming a middle-of-the-line (MOL) dielectric material and forming contact structures in the MOL dielectric material.

Referring now to FIG. 16, there is illustrated the exemplary semiconductor structure of FIG. 15 after forming a middle-of-the-line (MOL) dielectric material 44 and forming contact structures 46, 48 in the MOL dielectric material 44. The MOL dielectric material 44 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material 44. The use of a self-planarizing dielectric material as the MOL dielectric material 44 may avoid the need to perform a subsequent planarizing step. In one embodiment, the MOL dielectric material 44 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material 44, a planarization process or an etch back process follows the deposition of the dielectric material that provides the MOL dielectric material 44.

After providing the MOL dielectric material 44, various contact structures are formed into the MOL dielectric material 44. Notably, there is shown the structure after forming, in any order, a control gate contact structure (or word line) 48 extending through the MOL dielectric material 44 and contacting one of the control gate portions (i.e., 42R) and a source/drain contact structure (bit line) 46 contacting a surface of each top source/drain structure 32 and a topmost surface of the upper portion 28B of the epitaxial semiconductor channel material 28.

The various contact structures can be formed by first providing a contact opening within the MOL dielectric material 44. Lithography and etching, as defined above, can be used to provide each contact opening. Each contact opening is then filled with at least a contact metal such as, for example, copper, tungsten or a copper-tungsten alloy. In some embodiments, a metal semiconductor alloy, i.e., a silicide, may be formed prior to filling each contact opening with a contact metal. A planarization process may follow the fill of each contact opening.

In some embodiments (not shown), a conventional vertical transistor is formed adjacent to the device region illustrated in FIG. 16. The conventional vertical transistor would include two functional gate structures (each including a gate dielectric portion and a gate conductor portion) located on each side of another epitaxial semiconductor channel material that is formed in a different device region of the material stack shown in FIG. 1.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a floating gate memory cell located above a surface of a base semiconductor substrate, the floating gate memory cell comprising:
a bottom source/drain semiconductor layer located above the base semiconductor substrate,
an epitaxial semiconductor channel material extending upward from a topmost surface of the bottom source/drain semiconductor layer, the epitaxial semiconductor
channel material having a lower portion of a first width and an upper portion of a second width that is less than the first width,
a floating gate structure located on each side of the epitaxial semiconductor channel material, and
a top source/drain structure extending outward from each sidewall of the upper portion of the epitaxial semiconductor channel material.

2. The semiconductor structure of claim 1, further comprising a semiconductor material layer positioned between the bottom source/drain semiconductor material layer and the base semiconductor substrate, wherein the semiconductor layer is of a first conductivity type and the source/drain semiconductor material layer is of a second conductivity type that is opposite from the first conductivity type.

3. The semiconductor structure of claim 1, wherein each floating gate structure comprises an inner dielectric material portion, a floating gate portion, an outer dielectric material portion, and a control gate portion, wherein a portion of a sidewall surface of each inner dielectric material portion directly contacts a portion of a sidewall surface of the lower portion of the epitaxial semiconductor channel material.

4. The semiconductor structure of claim 3, wherein each floating gate portion is entirely surrounded by the inner dielectric material portion and the outer dielectric material portion.

5. The semiconductor structure of claim 4, wherein a portion of each inner gate dielectric material portion is located on a sidewall surface, a topmost surface and a bottommost surface of the floating gate portion.

6. The semiconductor structure of claim 3, wherein each control gate portion has a topmost surface that is coplanar with a topmost surface of the outer dielectric material portion.

7. The semiconductor structure of claim 3, wherein the inner dielectric material portion has a first thickness and the outer dielectric material portion has a second thickness, wherein the second thickness is greater than the first thickness.

8. The semiconductor structure of claim 1, further comprising a bottom spacer portion located beneath each floating gate structure and contacting a topmost surface of the bottom source/drain semiconductor material layer, and a top spacer structure located above a portion of each floating gate structure.

9. The semiconductor structure of claim 8, further comprising a dielectric spacer located on a topmost surface of the top spacer structure and laterally surrounding each top source/drain structure.

10. The semiconductor structure of claim 1, further comprising a middle-of-the line (MOL) dielectric material laterally surrounding the floating gate memory cell, wherein a first contact structure is present in the MOL dielectric material and contacting a surface of each top source/drain structure and a surface of the upper portion of the epitaxial semiconductor channel material and a second contact structure is present in the MOL dielectric and contacting a control gate portion of one of the floating gate structures.

11. A method of forming a semiconductor structure, the method comprising:
forming an epitaxial semiconductor channel material extending upward from a topmost surface of a bottom source/drain semiconductor material layer, the epitaxial semiconductor channel material having a lower portion of a first width and an upper portion of a second width that is less than the first width;
forming a top source/drain structure extending outward from each sidewall of the upper portion of the epitaxial semiconductor channel material and contacting exposed portions of a topmost surface of the lower portion of the epitaxial semiconductor channel material; and
forming a floating gate structure on each side of the epitaxial semiconductor channel material.

12. The method of claim 11, further comprising forming a middle-of-the-line (MOL) dielectric material laterally surrounding each floating gate structure and each top source/drain structure.

13. The method of claim 12, further comprising forming a first contact structure in the MOL dielectric material and contacting a surface of each top source/drain structure and a surface of the upper portion of the epitaxial semiconductor channel material, and a second contact structure in the MOL dielectric and contacting a control gate portion of one of the floating gate structures.

14. The method of claim 11, wherein the forming the epitaxial semiconductor channel material comprises:
    forming a material stack including at least the bottom source/drain semiconductor material layer, a bottom spacer layer, a sacrificial gate material layer, a top spacer layer, and a hard mask layer;
    forming an opening in the material stack to expose a portion of a topmost surface of bottom source/drain semiconductor layer;
    forming an oxide liner into exposed sidewalls of each remaining portion of the sacrificial gate material layer in the opening;
    forming the epitaxial semiconductor channel material from the exposed topmost surface of the bottom source/drain semiconductor material layer;
    recessing the epitaxial semiconductor channel material;
    forming a dielectric cap on a remaining portion of the epitaxial semiconductor channel material;
    removing the remaining portions of the hard mask layer; and
    laterally recessing exposed portions of the remaining portion of the epitaxial semiconductor channel material.

15. The method of claim 14, wherein the forming the material stack comprises forming a semiconductor material having a different conductivity type than the bottom source/drain semiconductor material layer directly beneath the bottom source/drain semiconductor material layer.

16. The method of claim 11, further comprising forming a dielectric spacer protecting each top source/drain structure prior to forming each floating gate structure.

17. The method of claim 11, wherein the forming the top source/drain structure comprises an epitaxial growth process.

18. The method of claim 11, wherein each floating gate structure comprises an inner dielectric material portion, a floating gate portion, an outer dielectric material portion, and a control gate portion, wherein a portion of a sidewall surface of each inner dielectric material portion directly contacts a portion of a sidewall surface of the lower portion of the epitaxial semiconductor channel material.

19. The method of claim 18, wherein the inner dielectric material portion has a first thickness and the outer dielectric material portion has a second thickness, wherein the second thickness is greater than the first thickness.

20. The method of claim 11, wherein the forming the floating gate structure comprises:
    forming a continuous layer of a first dielectric material above the bottom source/drain semiconductor material layer and surrounding the epitaxial semiconductor channel material and each top source/drain structure;
    forming a floating gate material on each side of the epitaxial semiconductor channel material and on a surface of the continuous layer of first dielectric material;
    patterning the continuous layer of first dielectric material to provide an inner dielectric material liner on each side of the epitaxial semiconductor channel material;
    patterning the floating gate material to provide a floating gate portion on each side of the epitaxial semiconductor channel material;
    forming a continuous layer of a second dielectric material surrounding the epitaxial semiconductor channel material and located on exposed surfaces of each inner dielectric material liner and each floating gate structure;
    forming a control gate material on each side of the epitaxial semiconductor channel material and on the continuous layer of second dielectric material;
    patterning the continuous layer of second dielectric material to provide an outer dielectric material liner on each side of the epitaxial semiconductor channel material; and
    patterning the control gate material to provide a control gate portion on each side of the epitaxial semiconductor channel material, wherein during the patterning portions of each inner dielectric liner and portions of each outer dielectric material liner are removed to provide an inner dielectric material portion and an outer dielectric material portion on each side of the epitaxial semiconductor channel material.

* * * * *